US010771098B2

(12) United States Patent
Cirillo et al.

(10) Patent No.: US 10,771,098 B2
(45) Date of Patent: Sep. 8, 2020

(54) METHOD FOR DETERMINING PHASE NOISE IN A PERIODICALLY MODULATED SIGNAL

(71) Applicant: Rohde & Schwarz GmbH & Co. KG, Munich (DE)

(72) Inventors: Luke Cirillo, Poing (DE); Andreas Lagler, Rosenheim (DE); Alexander Breitenfeld, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/159,350

(22) Filed: Oct. 12, 2018

(65) Prior Publication Data

US 2020/0119757 A1    Apr. 16, 2020

(51) Int. Cl.
| | |
|---|---|
| *H04B 1/10* | (2006.01) |
| *H03B 5/18* | (2006.01) |
| *H04L 1/20* | (2006.01) |
| *G01S 13/34* | (2006.01) |

(52) U.S. Cl.
CPC .............. *H04B 1/10* (2013.01); *G01S 13/343* (2013.01); *H03B 5/1847* (2013.01); *H04L 1/205* (2013.01); *H04L 1/206* (2013.01)

(58) Field of Classification Search
CPC ........ G01R 29/26; H04B 1/1027; H04B 1/10; H04J 11/0036; G01S 13/343; H03B 5/1847; H04L 1/205; H04L 1/206
USPC ........................................................ 375/226
See application file for complete search history.

(56) References Cited

U.S. PATENT DOCUMENTS

| | | | | |
|---|---|---|---|---|
| 7,907,923 | B2* | 3/2011 | Hausdorf | H03G 3/344 375/285 |
| 8,093,909 | B2* | 1/2012 | Wendler | G01R 29/26 324/613 |
| 8,711,992 | B2 | 4/2014 | Harada et al. | |
| 9,244,106 | B2* | 1/2016 | Eckert | G01R 29/26 |
| 9,485,598 | B2* | 11/2016 | Roth | G01R 29/26 |
| 10,020,830 | B2* | 7/2018 | Roth | H04B 17/0085 |
| 10,110,239 | B1* | 10/2018 | Shu | H03L 7/197 |
| 2005/0012934 | A1* | 1/2005 | Szafraniec | H04B 10/0795 356/484 |

(Continued)

OTHER PUBLICATIONS

Berkeley et al; Measuring Phase noise of pulsed RF signals using the 7000 series signal source analyzer ; Mar. 2016; Berkeley Nucleonics Corp; pp. 1-6 (Year: 2016).*

(Continued)

*Primary Examiner* — Amritbir K Sandhu
(74) *Attorney, Agent, or Firm* — Christensen O'Connor Johnson Kindness PLLC

(57) ABSTRACT

A method for determining phase noise in a periodically modulated signal is described. The modulated signal is processed to generate a processed signal from the modulated signal. At least an approximate period of a modulation of the modulated signal is determined from the processed signal. The type of modulation of the modulated signal is determined from the processed signal. The modulated signal is demodulated based on the determined period and the determined type of modulation to generate a demodulated signal, and the phase noise is determined from the demodulated signal. Moreover, a measurement device is described.

17 Claims, 1 Drawing Sheet

(56) References Cited

U.S. PATENT DOCUMENTS

2007/0266275 A1* 11/2007 Stimple ............ G01R 31/31727
                                                    714/700
2018/0136994 A1*  5/2018 Toledano .............. G06F 11/322
2019/0103893 A1*  4/2019 Lagler .................. H04B 1/7143
2019/0207683 A1*  7/2019 Kamiya ............. H04B 10/6165

OTHER PUBLICATIONS

Berkeley et al; Measuring Phase noise of pulsed RF signals using the 7000 series signal source analyzer; Mar. 2016; pp. 1-6 (Year: 2016).*

* cited by examiner

METHOD FOR DETERMINING PHASE NOISE IN A PERIODICALLY MODULATED SIGNAL

FIELD OF THE DISCLOSURE

Embodiments of the present disclosure relate generally to a method for determining phase noise in a periodically modulated signal as well as to a measurement device.

BACKGROUND

Quantifying phase noise of an oscillator is important in many applications like communications and radar, for instance in the automotive sector. In certain cases, the signal to be measured is modulated, in particular phase modulated, which makes traditional phase noise measurement methods impossible, since these assume a constant frequency or continuous wave (CW) oscillation. In time domain, the phase noise is often referred to as "jitter".

In applications where the signal is modulated in phase and/or frequency, e.g. for frequency modulated continuous wave (FMCW) radar applications, and the unmodulated signal is either not directly accessible for measurement due to tight integration of components or if the adverse effects of a frequency and/or phase modulator on the phase noise need to be taken into account, traditional CW measurement methods are not sufficient.

Therefore, there is a need for a method as well as for a measurement device capable of reliably analyzing phase noise in a modulated signal.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Embodiments of the present disclosure provide a method for determining phase noise in a periodically modulated signal. The modulated signal is processed to generate a processed signal from the modulated signal. At least an approximate period of a modulation of said modulated signal is determined from the processed signal. The type of modulation of the modulated signal is determined from the processed signal. The modulated signal is demodulated based on the determined period and the determined type of modulation to generate a demodulated signal, and the phase noise is determined from the demodulated signal.

Thereby and in the following, the term "periodically modulated signal" denotes that the modulation applied to the signal is a periodic modulation. In other words, the shape of functions used to modulate a carrier wave for generating the modulated signal repeats after a certain time, namely said period of the modulation.

With the method described above, phase noise in periodically modulated signals can be determined, which is at least in some cases not possible with traditional methods. As a first step, the exact type of modulation as well as at least the approximate period of the modulation of the modulated signal are determined. As the determination of the period relies on a measurement of the modulated signal, only an approximate period of the modulation can be determined, but the period of the modulation is determined or rather estimated with as high accuracy as possible, as the accuracy of the determined period is of high relevance for the quality of the result.

Once the type and period of the modulation is known, the periodically modulated signal is demodulated and thus essentially reduced to a continuous wave signal, which still contains the phase noise to be quantified. Afterwards, traditional phase noise determination methods can be applied to the demodulated signal in order to determine the phase noise contained within the original periodically modulated signal. This way, a reliable method for identifying and quantifying phase noise in periodically modulated signals is provided.

Note that it may be the processed signal which is demodulated, such that the phase noise contained in the processed signal is determined. The phase noise that is contained in the processed signal, however, is the same as the phase noise contained in the original periodically modulated signal. Thus, by determining the phase noise contained in the processed signal, also the phase noise contained in the periodically modulated signal is determined.

Alternatively, the type and the period of the modulation may be determined from the processed signal and may be forwarded to a demodulation unit, which then performs direct demodulation of the periodically modulated signal based on the determined type and the determined period of the modulation.

In some embodiments, the periodically modulated signal may be received before being processed, for example via a probe and/or an antenna.

In one embodiment according to the disclosure, the modulated signal is digitized to generate the processed signal. Put another way, the modulated signal is sampled to provide digital data points corresponding to the original modulated signal. The individual digital data points comprise information about the time the data point is sampled at as well as about a momentary amplitude and/or a momentary phase of the periodically modulated signal. The remaining steps are then performed based on these digital data points. In some embodiments, the period and the type of the modulation is determined from said data points.

Alternatively or additionally, other processing steps may be performed during processing of the modulated signal, for example smoothing and/or filtering of the modulated signal.

In another embodiment according to the disclosure, the type of modulation of the periodically modulated signal is assigned to the family of quadrature amplitude modulations (QAM). Although the term "quadrature amplitude modulations", which are also often called "IQ-modulations", is typically assigned to digital modulation techniques, it is to be understood to also comprise analog modulation techniques which are based on a time-dependent in-phase component I(t) and a time-dependent quadrature component Q(t) that are used to modulate a carrier wave having a certain carrier frequency. The in-phase component I(t) and the quadrature component Q(t) are periodic with said period.

According to one aspect of the disclosure, the type of modulation of the periodically modulated signal is assigned to at least one of the family of phase modulations and the family of frequency modulations. In some embodiments, the modulation may be of the type used for radar applications, for example FMCW radar applications. For example, the modulation may be chosen such that the frequency of the periodically modulated signal, when plotted against time, has a sawtooth-like shape around a central carrier frequency, wherein one period of this sawtooth-like shape is often referred to as a so-called "chirp" or "chirp signal".

According to another aspect of the disclosure, the period is determined by an autocorrelation of the processed signal. The resulting autocorrelation function has local maxima at integer multiples of the period of the modulation. Thus, the period of the modulation can be determined in a simple fashion by determining the distance between two adjacent maxima of the autocorrelation function. Alternatively or additionally, several such distances between adjacent maxima may be determined and averaged in order to enhance the accuracy of the results for the determined period. Alternatively or additionally, the distance between two arbitrary maxima of the autocorrelation function may be determined and divided by the number of maxima lying in between the two considered maxima plus 1.

At least one local maximum of an autocorrelation function resulting from the autocorrelation of the processed signal may be approximated via a model. In some embodiments, the at least one local maximum may be approximated by a polynomial, for example by a quadratic polynomial. Polynomials of even order typically provide a good approximation to functions in the vicinity of an extremum. Thus, it is not necessary to fully calculate the autocorrelation function. It is sufficient to calculate a finite, rather low number of points in a region where the maximum is supposed to be. Afterwards, the calculated final number of points can be used to adapt the parameters of the model, for example the parameters of the polynomial, such that the model reproduces the autocorrelation function at least in a vicinity of the corresponding maximum. This is particularly useful in the case where the periodically modulated signal is digitized, because the period of the modulated signal is not necessarily an integer multiple of the sampling rate and thus it would be impossible to determine the exact position of the maximum by simply comparing values of data points, as the real maximum simply might not be in the data.

In a particular embodiment of the disclosure, the demodulated signal is averaged over a time interval being a multiple of the determined period to determine the phase noise. By averaging over several periods of the modulated signal, the impact of statistical noise contained in the periodically modulated signal is averaged out and thus removed from the determined phase noise.

In another embodiment according to the disclosure, the phase noise is determined for specific samples in the processed signal corresponding to specific frequency offsets. In other words, a momentary frequency of the periodically modulated signal is associated with the corresponding momentary phase noise. This way, correlations between the momentary frequency and phase noise can be analyzed.

In some embodiments, the phase noise is determined for several frequency offsets that are different from each other. In other words, a momentary frequency of the periodically modulated signal is associated with the corresponding momentary phase noise, such that a distribution of the phase noise over momentary frequency is obtained. This way, a phase noise spectrum is obtained, wherein correlations between the momentary frequency and phase noise can be analyzed, for example in order to see if at certain frequency offsets of the frequency modulation the phase noise behavior changes.

According to another embodiment of the disclosure, the phase noise is visualized together with the modulated signal. More precisely, the phase noise spectrum is visualized together with the modulated signal. Thus, the user gets a direct, visual representation of the power density of the phase noise contained in the individual parts of the modulated signal having different frequencies.

For instance, the phase noise or rather the phase noise spectrum is calculated (and visualized) by using specific samples in the data corresponding to specific frequency offsets. The data relates to the processed signal. Accordingly, the phase noise can be characterized with respect to frequency offset(s).

The modulated signal may be processed using at least one of a radio frequency signal analyzer and/or an oscilloscope. In some embodiments, a spectrum analysis of the demodulated signal may be performed by the radio frequency signal analyzer and/or the oscilloscope in order to determine the phase noise.

According to a further aspect of the disclosure, an amplitude noise is determined from the demodulated signal. In some embodiments, the steps described above to determine the phase noise may also be done in order to determine the amplitude noise, but of course with the appropriate modifications.

In other words, a periodically modulated signal, such as a phase modulated signal or a frequency modulated signal, is processed, for example digitized.

From the respective data obtained during the processing of the periodically modulated signal, the period as well as the form (type of modulation) of the phase/frequency modulation is estimated or rather determined. The data obtained by the respective processing may relate to the data obtained by the digitization.

Then, the respective modulation, namely the phase/frequency modulation, is demodulated to yield phase noise samples. For the demodulation, the determined period as well as the determined form (determined type of modulation) are taken into account. In some embodiments, the demodulation is based on the determined period as well as the determined form type of modulation.

Once the phase noise samples are yielded, the phase noise spectrum may be calculated (and optionally visualized). In some embodiments, the phase noise spectrum can be determined easily by using specific samples of the data corresponding to specific frequency offsets. Thus, the phase noise may be characterized in dependency of a frequency offset.

Accordingly, a certain modulation, namely a periodic phase or frequency modulation, is reversed initially so that the data to be processed for determining the phase noise is reduced to a continuous wave signal containing only the phase noise to be quantified.

Further, the relationship between the frequency/phase modulation and the phase noise spectrum can be calculated or quantified. Optionally, this can be visualized. Thus, it is possible to verify if the phase noise behavior or the phase noise characteristic changes at certain frequency offsets of a frequency modulation.

In some embodiments, the phase noise is quantified precisely since the samples used for quantifying the phase noise are yielded without systematic variation.

Embodiments of the present disclosure also provide a measurement device. The measurement device comprises an input channel, a processing unit, a demodulation unit and a noise analysis unit, the input channel being configured to receive an input signal and to forward the input signal to the processing unit, the processing unit being configured to process the input signal to generate a processed signal from the input signal and to forward the processed signal to the demodulation unit, the demodulation unit being configured to determine the type and a period of a modulation of the input signal to generate a demodulated signal by demodulating the processed signal based on the period and the type of modulation and to forward the demodulated signal to the noise analysis unit, and the noise analysis unit being configured to determine at least one of a phase noise and an amplitude noise of the demodulated signal.

In some embodiments, some or all of the functionality of the processing unit, the demodulation unit and/or the noise analysis unit can be carried out in specially configured hardware or software or a combination of specially configured hardware and software. For example, the processing unit, the demodulation unit and/or the noise analysis unit in some embodiments may include, with or without additional components, digital circuits, analog circuits, programmed processors, SoCs, FPGAs, ASICs, etc., and/or combinations thereof.

In some embodiments, the measurement device is configured to perform the method described above, wherein the periodically modulated signal corresponds to the input signal. With respect to the advantages, reference is made to the explanations given above.

In one embodiment of the disclosure, the measurement device is established by at least one of an radio frequency signal analyzer or an oscilloscope. Thus, a radio frequency analyzer and/or an oscilloscope may be complemented with a processing unit and a demodulation unit as described above.

The measurement device may be configured to do a spectrum analysis of the demodulated signal.

According to another embodiment of the disclosure, the processing unit comprises an analog-to-digital converter. Via the analog-to-digital converter, the input signal is sampled to provide digital data points corresponding to the original modulated signal. The individual digital data points comprise information about the time the data point is sampled at as well as about a momentary amplitude and/or a momentary phase of the periodically modulated signal.

In some embodiments, the demodulation unit comprises a correlation unit being configured to generate an autocorrelation of the processed signal. Moreover, the correlation unit may be configured to generate an autocorrelation function of the processed signal and to determine the period of the modulation from the autocorrelation function.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
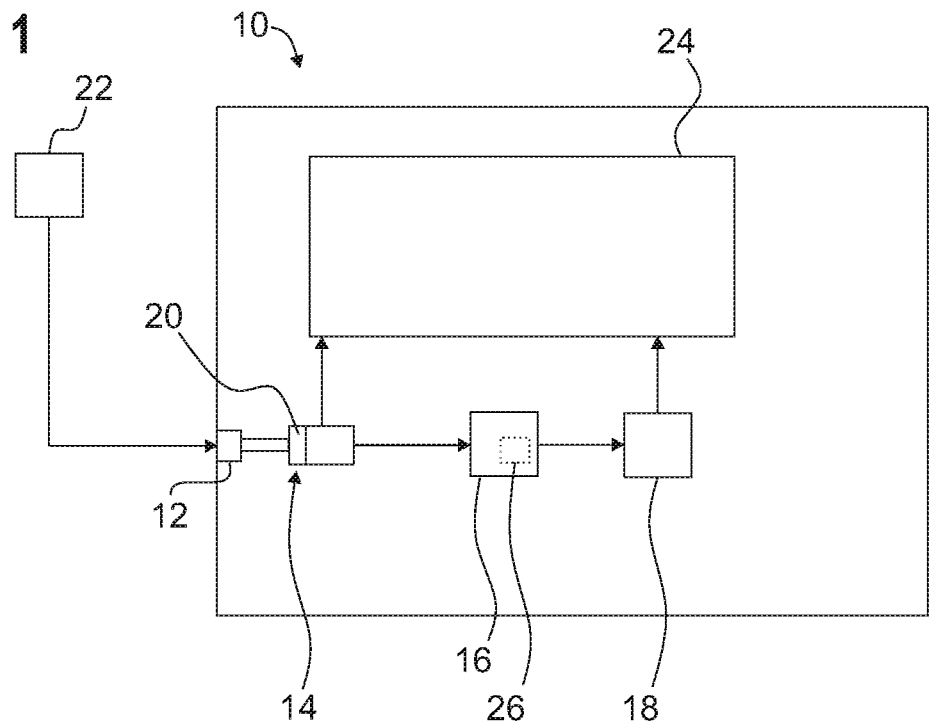
FIG. 1 schematically shows a representative embodiment of a measurement device according to the disclosure.

FIG. 1 schematically shows a measurement device 10, which may for example be at least one of a radio frequency analyzer or an oscilloscope. As shown in FIG. 1, the measurement device 10 comprises at least one input channel 12, a processing unit 14, a demodulation unit 16 and a noise analysis unit 18. Moreover, the measurement device 10 may comprise a display unit 24 that is configured to display signals and/or data processed by the measurement device 10.

The processing unit 14, the demodulation unit 16 and the noise analysis unit 18 may be real, physical units that form separate or integrated parts within the measurement device 10. Alternatively, the individual units 14, 16, 18 may be program code blocks running on a central control unit, processor or the like of the measurement device 10. In some embodiments, some or all of the functionality of the processing unit 14 can be carried out in specially configured hardware or software or a combination of specially configured hardware and software. For example, the processing unit 14 in some embodiments may include, with or without additional components, digital circuits, analog circuits, programmed processors, SoCs, FPGAs, ASICs, etc., and/or combinations thereof.

The measurement device 10 is configured to receive an input signal via the at least one input channel 12, which input signal may be an analog and/or a digital one. In some embodiments, if the input signal is an analog one, the processing unit 14 may comprise an analog-to-digital converter 20 being assigned to the at least one input channel 12 and being configured to digitize the analog part of the input signal.

The input signal may be received by a probe 22 being attached to the input channel 12 in a signal transmitting manner and may be forwarded to the input channel 12 by the probe 22. For example, the probe 22 is established as an antenna element, in particular as a radio frequency antenna.

The measurement device 10 is configured to perform a method for determining phase noise in an input signal being a periodically modulated signal, for instance a signal with periodic frequency modulation or a signal with periodic phase modulation. In other words, the periodically modulated signal may be assigned to the family of phase modulations and/or frequency modulations.

Thereby and in the following, the term "periodically modulated signal" denotes that the modulation applied to the signal is a periodic modulation. In other words, the shape of functions used to modulate a carrier wave for generating the modulated signal repeats after a certain time that is called period $T_m$ of the modulation.

The modulation may be a quadrature amplitude modulation (QAM), which is often referred to as "IQ-modulation". Although this term is typically assigned to digital modulation techniques, it is to be understood to also comprise analog modulation techniques which are based on a time-dependent in-phase component I(t) and a time-dependent quadrature component Q(t) that are used to modulate a carrier wave having a certain carrier frequency $f_c$. The in-phase component I(t) and the quadrature component Q(t) are periodic with said period $T_m$.

In some embodiments, the modulation may comprise modulating the frequency, the amplitude and/or the phase of the carrier wave. For example, the modulation is of the type used for radar applications, in particular FMCW radar applications. The modulation may be chosen such that the frequency of the periodically modulated signal, when plotted against time, has a sawtooth-like shape around the central carrier frequency $f_c$, wherein one period of this sawtooth-like shape is often referred to as a so-called "chirp".

Figure 2:
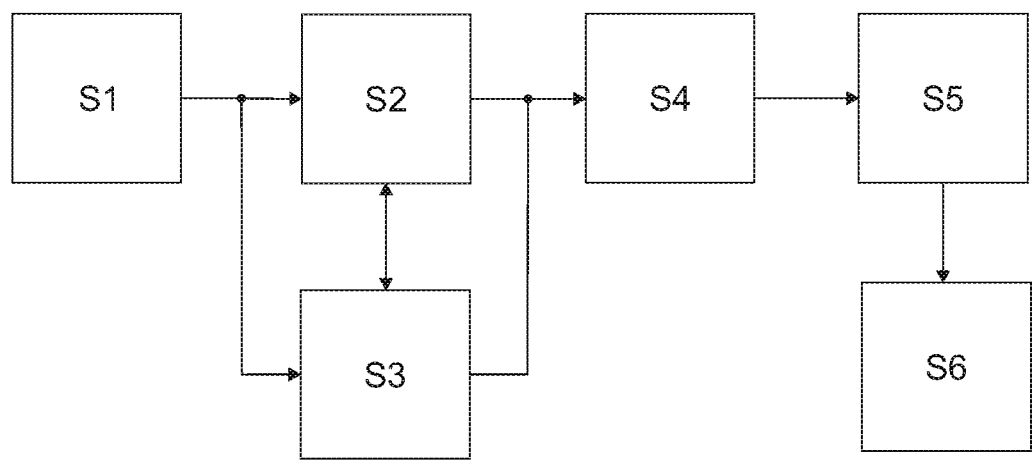
FIG. 2 schematically shows a flow chart of representative embodiment of a method for determining phase noise according to the disclosure.

In the following, the method for determining the phase noise is explained with reference to FIGS. 1 and 2.

First, the periodically modulated signal is processed by the processing unit 14, for example digitized by the analog-to-digital converter 20, such that a processed signal is generated from the modulated signal (step S1). The processed signal is forwarded to the demodulation unit 16.

In order to digitize the periodically modulated signal, the modulated signal is sampled to provide digital data points corresponding to the original modulated signal. The individual digital data points comprise information about the time the data point is sampled at as well as about a momentary amplitude, a momentary frequency and/or a momentary phase of the periodically modulated signal. However, other processing steps may be also performed during step S1, for example smoothing and/or filtering of the modulated signal.

The demodulation unit 16 determines the above-mentioned period $T_m$ of the modulation of the modulated signal (step S2), at least an approximate period $T_m$, from the processed signal, in particular from the digital data points. In step S2, an autocorrelation of the processed signal may be performed such that an autocorrelation function of the processed signal is generated. For this purpose, the demodulation unit 16 may comprise a correlation unit 26 being configured to perform the autocorrelation and to generate the autocorrelation function.

As can be seen from the definition of the autocorrelation function $\psi_{xx}$ of a periodic signal x(t), which reads $$\psi_{xx}(\tau) = \lim_{T \to \infty} \frac{1}{2T} \int_{-T}^{T} x^*(t)x(t+\tau),$$

the autocorrelation function of the periodic signal x(t) has local maxima when $\tau$ is equal to an integer multiple of the period of the periodic signal x(t).

Accordingly, the autocorrelation function of the periodically modulated signal has local maxima at points where $\tau$ equals an integer multiple of the modulation period $T_m$. Thus, the modulation period $T_m$ can be determined in a simple fashion by determining the distance between two adjacent maxima of the autocorrelation function, i.e. the difference of the corresponding abscissae.

Alternatively or additionally, several such distances between adjacent maxima may be determined and averaged in order to enhance the result for the determined modulation period $T_m$. Alternatively or additionally, the distance between two arbitrary maxima of the autocorrelation function may be determined and divided by the number of maxima lying in between the two considered maxima plus 1, which is essentially equal to averaging over the distance between several adjacent maxima.

Moreover, the autocorrelation function may be approximated via a model, for example if the processed signal is digitized. In some embodiments, the at least one local maximum may be approximated by a polynomial, for example by a quadratic polynomial. Polynomials of even order typically provide a good approximation to functions in the vicinity of an extremum. Thus, there is no need to fully calculate the autocorrelation function. It is sufficient to calculate a finite number of points in a region where the maximum is likely to be, after which the calculated finite number of points can be used to adapt the parameters of the model, for example the parameters of the polynomial, such that the model reproduces the autocorrelation function at least in the vicinity of the corresponding maximum.

This is particularly useful in the case where the periodically modulated signal is digitized, because the period $T_m$ of the modulated signal is not necessarily an integer multiple of the sampling rate $T_S$, i.e. $T_m \neq m^* T_S$ with m being an integer, and thus it would be impossible to find the exact position of the maximum by comparing values of the data points alone, as the maximum may not even be part of the data points.

Subsequent or parallel to step S2, the exact type of the modulation of the modulated signal, namely the form of modulation, is determined from the processed signal (step S3), for example from the digitized processed signal. For a better accuracy, the processed signal may be averaged over a time span that is an integer multiple of the (estimated) modulation period $T_m$. In the case of IQ-modulations, for example, this means that the functions I(t) and Q(t), that are used to modulate the carrier wave, are reconstructed or more precisely estimated from the processed signal. In the case of FMCW radar applications, this means that the bandwidth $B_C$, which is also called "frequency sweep", and the specific form of the sawtooth-like signal are estimated from the processed signal.

Now, the period $T_m$ as well as the type of modulation of the periodically modulated signal are known, and are used by the demodulation unit 16 to demodulate the processed signal, whereby a demodulated signal is generated from the processed signal (step S4). This essentially reduces the processed signal to a continuous wave signal, which still or only contains the phase noise to be quantified.

Afterwards, traditional phase noise determination methods can be applied to the demodulated signal in order to determine the phase noise contained within the processed signal (step S5), which is the same phase noise that is contained within the original periodically modulated signal.

Optionally, the phase noise may be determined for specific samples in the processed signal that correspond to specific frequency offsets, e.g., to a specific momentary frequency of the periodically modulated signal. In other words, a momentary frequency of the periodically modulated signal is associated with the corresponding momentary phase noise, such that a distribution of the phase noise over momentary frequency, or in other words a phase noise spectrum is obtained. This way, correlations between the momentary frequency of the modulated signal and the momentary phase noise of the modulated signal can be analyzed, for example in order to see if the phase noise behavior of the modulated signal changes at certain frequency offsets.

Moreover, the phase noise spectrum may be visualized via the display unit 24 (step S6), for example together with the periodically modulated signal.

Optionally, the steps described above may be repeated, with the necessary adaptations, in order to also determine an amplitude noise contained in the periodically modulated signal.

As briefly stated above, some or all of the functionality of the analyzer, the processing unit, the demodulation unit and/or the noise analysis unit can be carried out in specially configured hardware or software or a combination of specially configured hardware and software. For example, the analyzer, the processing unit, the demodulation unit and/or the noise analysis unit in some embodiments may include, with or without additional components, digital circuits, analog circuits, programmed processors, SoCs, FPGAs, ASICs, etc., and/or combinations thereof.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for determining phase noise in a periodically modulated signal, the method comprising the following steps:
    processing the periodically modulated signal to generate a processed signal from the periodically modulated signal;
    determining at least an approximate period of a modulation of the periodically modulated signal from the processed signal;
    determining a type of modulation of the periodically modulated signal from the processed signal;
    demodulating the modulated signal based on the determined period and the determined type of modulation to generate a demodulated signal, wherein the demodulated signal corresponds to a continuous wave signal containing the phase noise to be quantified; and
    determining the phase noise from the demodulated signal.

2. The method of claim 1, wherein the periodically modulated signal is digitized to generate the processed signal.

3. The method of claim 1, wherein the type of modulation of the periodically modulated signal is assigned to a family of quadrature amplitude modulations.

4. The method of claim 1, wherein the type of modulation of the periodically modulated signal is assigned to at least one of a family of phase modulations and a family of frequency modulations.

5. The method of claim 1, wherein the approximate period is determined by an autocorrelation of the processed signal.

6. The method according to claim 5, wherein at least one local maximum of an autocorrelation function resulting from the autocorrelation of the processed signal is approximated via a model.

7. The method of claim 1, wherein the demodulated signal is averaged over a time interval being a multiple of the determined approximate period to determine the phase noise.

8. The method of claim 1, wherein the phase noise is determined for specific samples in the processed signal corresponding to specific frequency offsets.

9. The method of claim 8, wherein the phase noise is determined for several frequency offsets that are different from each other.

10. The method of claim 1, wherein the phase noise is visualized together with the periodically modulated signal.

11. The method of claim 1, wherein the periodically modulated signal is processed using at least one of a radio frequency signal analyzer or an oscilloscope.

12. The method of claim 1, wherein an amplitude noise is determined from the demodulated signal.

13. A measurement device, comprising: an input channel, a processing unit, a demodulation unit and a noise analysis unit,
    the input channel being configured to receive an input signal and to forward the input signal to the processing unit,
    the processing unit being configured to process the input signal to generate a processed signal from the input signal and to forward the processed input signal to the demodulation unit,
    the demodulation unit being configured to determine a type and a period of a modulation of the input signal to generate a demodulated signal by demodulating the processed signal based on the period and the type of modulation and to forward the demodulated signal to the noise analysis unit, wherein the demodulated signal corresponds to a continuous wave signal containing the phase noise to be quantified, and
    the noise analysis unit being configured to determine at least one of a phase noise and an amplitude noise of the demodulated signal.

14. The measurement device of claim 13, wherein the measurement device is established by at least one of a radio frequency signal analyzer or an oscilloscope.

15. The measurement device of claim 13, wherein the processing unit comprises an analog-to-digital converter.

16. The measurement device of claim 13, wherein the demodulation unit is configured to generate an autocorrelation of the processed signal.

17. A method for determining phase noise in a periodically modulated signal, the method comprising the following steps:
    processing the periodically modulated signal to generate a processed signal from the periodically modulated signal;
    determining at least an approximate period of a modulation of the periodically modulated signal from the processed signal, wherein the approximate period of the modulation of the periodically modulated signal is determined by an autocorrelation of the processed signal;
    determining a type of modulation of the periodically modulated signal from the processed signal;
    demodulating the modulated signal based on the determined period and the determined type of modulation to generate a demodulated signal; and
    determining the phase noise from the demodulated signal.

* * * * *